United States Patent [19]

Worley et al.

[11] 3,753,166

[45] Aug. 14, 1973

[54] SURFACE WAVE BANDPASS FILTER WITH NON-LINEAR FM INPUT AND OUTPUT TRANSDUCERS AND DESIGN METHOD THEREFOR

[75] Inventors: James C. Worley, Sudbury; Robert Price, Lexington, both of Mass.

[73] Assignee: Sperry Rand Corporation

[22] Filed: Dec. 6, 1971

[21] Appl. No.: 204,806

[52] U.S. Cl. .......................... 333/72, 333/30, 310/83
[51] Int. Cl. .......................... H03h 7/10, H03h 9/00
[58] Field of Search .......................... 333/30, 71, 72; 310/8.3

[56] References Cited

UNITED STATES PATENTS

| | | | |
|---|---|---|---|
| 3,633,132 | 1/1972 | Hartemann | 333/72 |
| 3,376,572 | 4/1968 | Mayo | 333/72 X |
| 3,688,223 | 7/1972 | Willis et al. | 333/72 |
| 3,675,163 | 7/1972 | Hartemann | 333/72 |
| 3,568,102 | 3/1971 | Tseng | 333/30 |
| 3,548,306 | 12/1970 | Whitehouse | 333/30 |

*Primary Examiner*—Rudolph V. Rolinec
*Assistant Examiner*—Saxfield Chatmon, Jr.
*Attorney*—Howard P. Terry

[57] ABSTRACT

A microwave acoustic surface wave bandpass filter comprises a piezoelectirc substrate with interdigital comb input and output transducers on the surface thereof. The spacing of the interdigital fingers of the input transducer is chosen to be a non-linear function of the distance along the transducer. Thus the input transducer is constructed to possess a non-linear frequency versus time response such that the amplitude versus frequency response thereof is the square root of the desired amplitude versus frequency response of the filter. The output transducer is constructed as a translated image of the input transducer thereby providing the matched filter thereof. The desired amplitude versus frequency characteristic of the filter is the square of the amplitude versus frequency characteristic of either of the transducers.

A method for deriving the non-linear FM function that provides the desired amplitude versus frequency characteristic for the filter is disclosed.

8 Claims, 3 Drawing Figures

SURFACE WAVE BANDPASS FILTER WITH NON-LINEAR FM INPUT AND OUTPUT TRANSDUCERS AND DESIGN METHOD THEREFOR

BACKGROUND OF THE INVENTION

1. Field of the Invention

The invention pertains to bandpass filters particularly of the microwave acoustic surface wave variety.

2. Description of the Prior Art

Microwave acoustic surface wave bandpass filters are known that comprise a substrate with interdigital comb structures on the surface thereof providing input and output transducers, respectively. Filters of this type are discussed in the article, "Acoustic Surface Wave Filters" by R. H. Tancrell and M. G. Holland published in the *Proceedings of the IEEE*, Volume 59, No. 3, March, 1971, on page 393.

In order that a prior art surface wave filter be designed to achieve a particular, symmetric amplitude versus frequency passband, the finger spacing in both transducers is chosen to be uniform to correspond to the desired center frequency of the passband. Additionally, the finger overlap in one of the transducers is chosen as closely as possible to conform to the Fourier transform, taken with respect to frequency relative to the passband center, of the desired amplitude versus frequency function. This method of design is based on well known Fourier-theory relationships between amplitude versus frequency characteristics, and corresponding time or impulse responses, of linear filters. The other transducer of the prior art surface wave filter is chosen to be broadband by utilizing only a few finger pairs with uniform and large overlap.

Prior art surface wave bandpass filters constructed in accordance with this approach suffer from numerous disadvantages. Since the time responses corresponding to many spectral amplitude functions have a plurality of zeros, it is often required that a corresponding plurality of finger pairs in the shaped transducers have zero overlap. A finger pair with very small overlap functions as a point energy source causing excessive beam spreading or diffraction of the acoustic signals generated by them. Thus not only is the insertion loss of the filter increased by this condition because of the dissipated energy, but the diffracted beam also interferes with proper filter operation thus seriously degrading the response thereof. This beam spreading may to some extent be overcome by using directional or focusing materials for the filter substrate. Such focusing materials tend to be significantly more expensive than non-focusing materials and in addition such focusing materials normally have a surface wave velocity that is not constant over temperature whereas the less expensive non-focusing materials normally have surface wave velocities that are constant over large temperature ranges. When utilizing the focusing materials to overcome the beam spreading problem, an expensive temperature controlled environment such as an oven is normally required. Thus it is appreciated that although to some extent the beam spreading problem may be obviated, additional difficulties are introduced by the solutions.

The time responses of most spectral amplitude functions extend to infinity. The physical truncation of the time response instrumented by a physically realizable transducer of finite length causes additional distortion of the desired amplitude versus frequency characteristic of the filter.

Although in these prior art filter designs it is desirable to construct the non-shaped broadband transducer so as to have a flat frequency response, this cannot normally be achieved. Thus the response of the broadband transducer will further perturb the overall response of the filter from that which is desired. Additionally, since the finger pairs of both transducers are resonant at only the center frequency of the band, an undesirably high insertion loss results for the filter. Furthermore, the above described design approaches to some extent limit the practical bandwidth that may be achieved.

It will be appreciated that because of the vastly different shapes of the two transducers utilized in the above-described prior art design approach, the input impedance looking into one of the transducers will differ significantly from that looking into the other transducer. This is an undesirable situation from a system design consideration.

A prior art surface wave bandpass filter may be instrumented in accordance with the above described design approaches to, for example, have a rectangular amplitude versus frequency response. In this instance, the overlap of the finger pairs of one of the transducers would be formed in accordance with a sine $x/x$ shape as a function of distance along the transducer with all of the finger pairs of both transducers resonant at the center frequency of the desired passband. Since the sine $x/x$ function has numerous zeros with sidelobes extending to infinity, the resultant filter would suffer from the numerous disadvantages discussed above.

Another approach to the design of surface wave bandpass filters, known prior to the present invention, is to construct each of the input and output transducers to possess a fixed linear frequency versus time characteristic such that the two transducers are matched filters of one another. This linear FM characteristic is instrumented by utilizing a linear grading with regard to the spacing between the fingers of the transducers. The amplitude versus frequency characteristic of the filter is then controlled by varying the finger overlap in accordance with the desired spectral amplitude function. This may be a satisfactory approach for amplitude versus frequency characteristics that do not have any zeros or low amplitude points within the passband of the function. If, however, the desired amplitude versus frequency characteristic does have zeros of low amplitude points within the passband, the small resultant finger overlaps will result in the disadvantages discussed above.

The amplitude versus frequency characteristics of many useful bandpass filters have zeros or low amplitude points within the passbands thereof. For example, the filter utilized in many commercial television receivers for separating the audio and video signals has zeros within its passband. Such a filter cannot conveniently be instrumented utilizing the design approaches of the prior art.

It will be appreciated that the prior art design approaches require shaping of the finger overlap to determine the amplitude versus frequency response of the filter. Finger overlap determines the amplitude of the surface wave signal generated by a finger pair. Thus since the finger overlap is a function of position along the transducer, the amplitude of the emitted surface wave signal will be amplitude modulated. In the prior art approaches, the finger overlap function is utilized so that the frequency response and the corresponding time response provides the desired filter characteristics. The finger overlap function can also be used to compensate for frequency dependent surface wave propagation effects such as beam spreading and propagation loss. However, finger overlap determines the surface wave amplitude emitted by a finger pair because its impedance match to the input signal source or the utilization load is determined by the overlap. Thus, if a weak signal from a finger pair is required, that pair is deliberately mismatched. Thus when using the prior art approaches, and particularly the linear FM approach discussed above, in which the finger overlap function must be used for spectrum shaping and compensation, excessive insertion loss is experienced. Additionally, these prior art approaches do not provide any design flexibility since the finger overlap function is utilized to control the desired amplitude versus frequency characteristic of the filter and therefore cannot effectively be utilized for any other desirable function.

SUMMARY OF THE INVENTION

The present invention provides surface wave bandpass filters with amplitude versus frequency characteristics that may have zeros or low amplitude points within the passband without the disadvantages discussed above. This is accomplished by utilizing the phase versus time characteristic of the transducers to provide the desired spectral amplitude characteristic of the bandpass filter. Thus it is possible to independently control the amplitude of the time response of the transducers by means of the finger overlap function and the frequency spectrum amplitude by means of the phase versus time function. The finger overlap function can then be utilized to impart desirable characteristics to the filter with regard, for example, to beam spreading and impedance matching.

The surface wave bandpass filter, in accordance with the invention, utilizes input and output transducers that are matched filters of each other, each transducer having a non-linear frequency versus time characteristic. The non-linear frequency versus time characteristic is chosen such that the corresponding phase versus time characteristic imparts the desired spectral amplitude characteristic to the bandpass filter. With this approach, the finger overlap of each transducer can be large and uniform or can be moderately shaped to impart other desirable characteristics to the filter.

DESCRIPTION OF THE PREFERRED EMBODIMENT

Figures 1, 2:
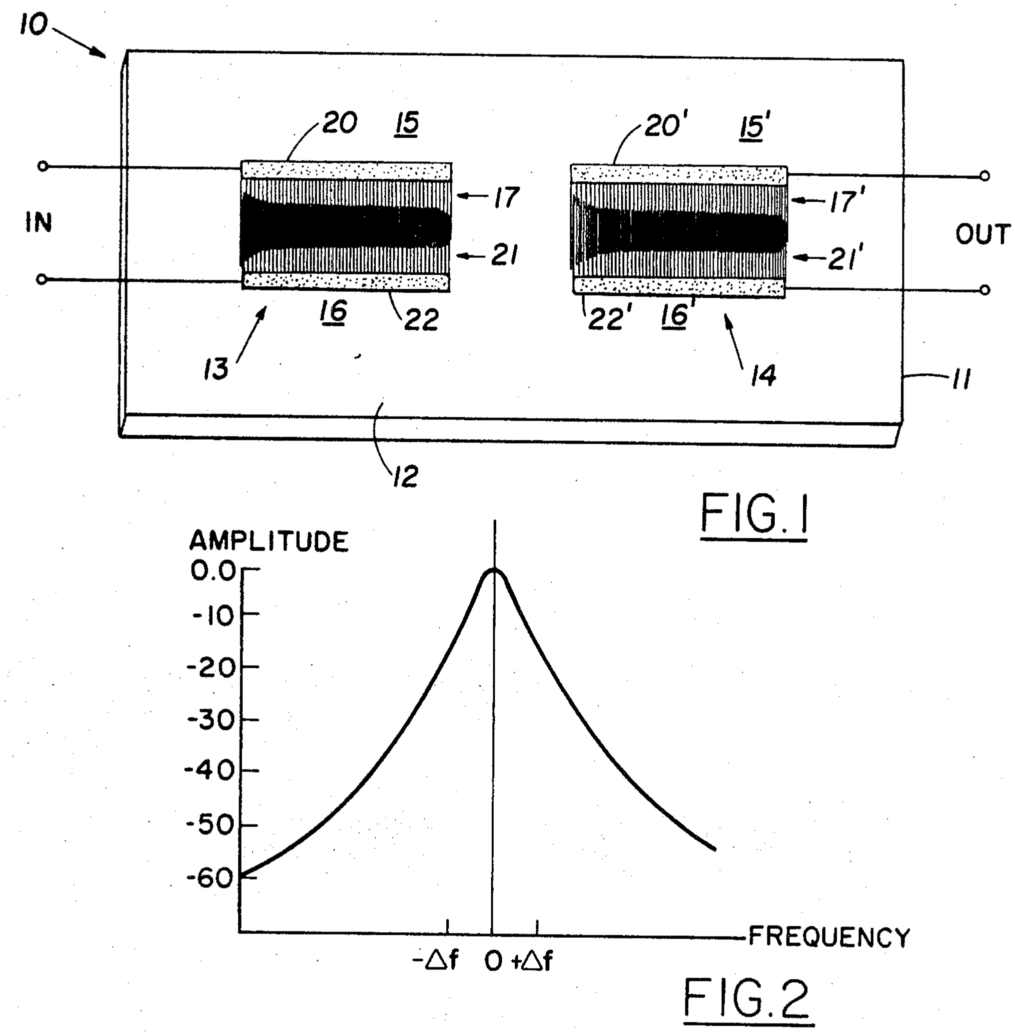
FIG. 1 is a plan view of a microwave acoustic surface wave bandpass filter instrumented in accordance with the invention.
FIG. 2 is a graph of a typical amplitude versus frequency bandpass function that may be instrumented in accordance with the invention.

Referring now to FIG. 1, a surface wave bandpass filter 10 is illustrated comprising a substrate 11 on a surface 12 of which is deposited an input transducer 13 and an output transducer 14. The substrate 11 may be composed of any suitable material which in the preferred embodiment of the invention is chosen as a piezoelectric material such as lithium niobate or quartz. The transducers 13 and 14 are composed of any suitable metal such as, for example, aluminum, deposited on the surface 12 of the substrate 11 by any suitable technique known in the printed circuits art. The transducer 13 is comprised of comb structures 15 and 16. The comb structure 15 is comprised of a set of intedigital fingers or teeth 17 electrically connected to a bus 20. The comb 16 is similarly comprised of a set of fingers 31 electrically connected to a bus 22. The fingers 17 of the comb 15 are interleaved but electrically isolated from the fingers 21 of the comb 16. The fingers 17 and 21 are spaced with respect to each other along the transducer 13 and the fingers 17 and 21 overlap with respect to each other along the transducer 13, the finger spacing and overlap determining the characteristics of the filter 10 in a manner to be described.

The transducer 14 is a translated image of the transducer 13 and therefore need not be descirbed in detail for brevity.

It will be appreciated that in a manner to be described hereinafter, the inter-finger spacing and overlap of the transducers 13 and 14 determine the amplitude versus frequency characteristic of the filter 10. For example, the transducers may be designed to provide a spectral amplitude characteristic of amplitude versus frequency as illustrated in FIG. 2. The input and output transducers 13 and 14 in FIG. 1 are in fact illustrated to instrument the bandpass characteristic of FIG. 2. The structural details of the transducer 13 or 14 may be appreciated from FIG. 3 which is a magnified view thereof and in which like reference numerals indicate like elements with respect to FIG. 1. The transducer of FIG. 3 provides the spectral amplitude characteristic of FIG. 2 in a manner to be clarified hereinafter.

Figure 3:
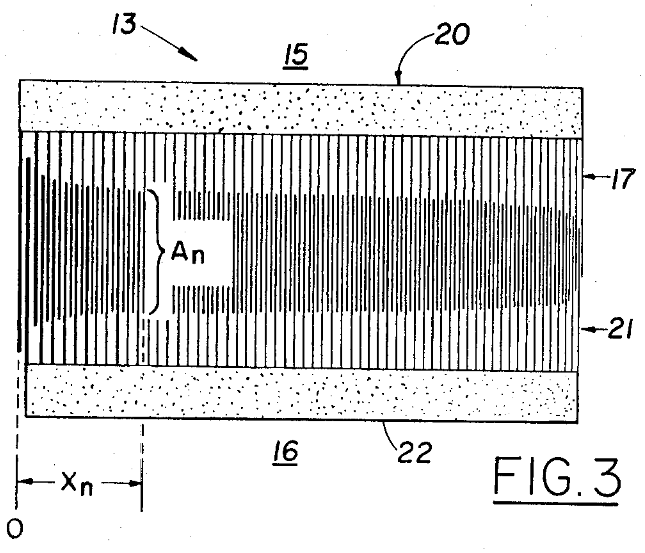
FIG. 3 is a plan view of the input or output transducer utilized in instrumenting the bandpass filter having the characteristic of FIG. 2.

Referring to FIGS. 1 and 3, it is understood that when a voltage impulse is impressed across the buses 20 and 22, an acoustic wave is launched along the surface 12 generally in the shape of the electric field established between the overlapping fingers of the combs 15 and 16. This acoustic wave passes under the transducer 14 wherein it is reconverted to electrical signals at the buses 20' and 22'. The electrical-to-mechanical conversion that takes place at the transducer 13 and the mechanical-to-electrical conversion that takes place at the transducer 14, occur in accordance with the transfer characteristics of the transducers. Since the input signal applied to the transducer 13 is multiplied by its transfer characteristic and the resultant mechanical signal is further multiplied by the transfer characteristic of the output transducer 14; and since the transducers 13 and 14 are translated images of one another, the input to output transfer characteristic for the filter 10 is the square of the transfer characteristic of each of the transducers 13 and 14.

In the bandpass filter 10, illustrated in FIGS. 1 and 3, the spacing between the fingers of the transducers 13 and 14 are, in accordance with the invention, graded in a non-linear manner across the transducers. Thus, it is appreciated that each transducer has a time or impulse response in the form of a wave packet of length equal to the transducer length, whose frequency varies non-linearly across the wave packet in accordance with the non-linear spacing of the interdigital fingers, and whose envelope is in the shape of the finger overlap. It is therefore appreciated that the transducers 13 and 14, in accordance with the invention, comprise non-linear FM pulse expansion and compression filters, respectively, matched so as to produce correlation.

The acoustic wave impressed upon the surface 12 by the transducer 13 has a non-linear frequency characteristic with respect to the distance along the transducer. This characteristic may be considered as a frequency versus time characteristic by reason of the wave propagation velocity along the surface. The frequency versus time characteristic of the wave uniquely specifies a phase versus time characteristic therefor. This phase characteristic of the waveform determined by the finger spacing coupled with the amplitude versus time characteristic thereof determined by the finger overlap completely specifies the time or impulse response of the transducer. Thus in accordance with the well-known precepts of Fourier transform theory, the amplitude versus frequency characteristic for each of the transducers 13 and 14 is completely determined, thereby determining the spectral amplitude characteristics for the bandpass filter 10. The phase versus frequency, or spectral phase characteristic, of the filter is also determined by the configuration of the transducers. It is known, however, that the spectral phase from the input to the output of two matched filters arranged to produce correlation is a linear function as is normally desirable in bandpass filter design. The spectral phase for each of the transducers is determined by the required frequency versus time FM function.

The procedure for determining the FM function required to provide the desired spectral amplitude characteristic for the filter is based on the principle of stationary phase which results in an FM signal design method that permits independent control of the time domain amplitude of the function and its frequency spectrum amplitude. These procedures are disclosed in an article by E. N. Fowle "The Design of FM Pulse Compression Signals," published in the Jan., 1964, issue of the IEEE Transactions on Information Theory, page 61. These principles are also disclosed in the textbook, "Radar Signals" by C. E. Cook and M. Bernfeld published in 1967 by the Academic Press, Sections 3.1 through 3.4

Generally, the procedure, in accordance with the invention, comprises determining the amplitude versus frequency characteristic desired for the bandpass filter. This spectral amplitude characteristic may then be modified to compensate for beam spreading the propagation loss, as well as to impart other desirable characteristics to the filter. This spectral amplitude characteristic may be designated as $|U(\omega)|^2$, where $\omega=2\pi f$, $f$ designating the frequency. The procedure described in the said Fowle article and the said Cook and Bernfeld textbook may be utilized to provide frequency, $\omega$, as a function of time, $t$ i.e., an FM modulation function, in order to obtain the desired spectral amplitude characteristic for the filter in a manner further to be described. The finger overlap function, designated as $a(t)$, may be chosen from other considerations also further to be described. It is appreciated that this design procedure is based on applying the principle of stationary phase and is accurate for transducers with large time-bandwidth products. Normally, the restriction on the time response is that the time-bandwidth product of the FM be greater than approximately 10.

The derived frequency versus time function $f(t)$ is expressible as a corresponding phase versus time function $\phi(t)$ which may, in turn, be expressed as phase as a function of distance along the transducer $\phi(x)$ by means of the surface wave propagation velocity. The transducer is disposed on the surface of the substrate such that a finger edge occurs every time the phase changes by $\pi/2$. It will thus be appreciated that when using the non-linear grading of the finger spacing in accordance with the invention, the desired amplitude versus frequency characteristic and compensation may be provided by the non-linear grading function. Thus, the finger overlap function can be determined by the desired time amplitude response, which may be chosen in accordance with other parameters such as impedance matching or beam diffraction, combined with a slight modulation of finger overlap in accordance with the relation disclosed in the said Tancrell and Holland article which is necessary to compensate for the non-constant sampling rate of the time domain waveform by the transducer.

Thus it is appreciated that the use of a non-linear FM function in designing the transducers of the bandpass filter renders it possible to independently control the amplitude of the time response of a transducer, i.e., the overlap of the fingers of the transducer, and its frequency spectrum amplitude. Each of the transducers is designed in accordance with the invention so that its spectral amplitude is the square root of the desired spectral amplitude for the filter, while the time amplitude function is chosen in view of other parameters as described above.

More specifically, a desired spectral amplitude characteristic for a bandpass filter may be designated as $A(\omega)$ and the time amplitude function therefor expressed as $a(t)$. To determine the non-linear FM function corresponding to $A(\omega)$ and $a(t)$, two equations from the said Fowle article may be utilized as follows:

$$\frac{1}{2\pi}\int_{\omega}^{\infty} |U(\omega)|^2 d\omega = \int_{0}^{t} |u(t)|^2 dt \quad (1)$$

and $$\phi'(t) = 2\pi f(t) \quad (2)$$

For bandpass filters, the expression $|A(\omega)|$ is substituted for the expression $|U(\omega)|^2$ and the expression $a^2(t)$ is substituted for the expression $|u(t)|^2$ in equation 1 and the indicated integrations are performed. The resultant expression is then solved for $\omega$ which provides an equation of frequency in terms of time utilizing the well-known relationshp $\omega=2\pi f$. The resulting frequency versus time equation is then substituted into equation 2 and integrated to provide the desired phase function of time $\phi(t)$. The phase versus time equation is then converted from a dependence on t to a dependence on distance $x$ along the transducer by the relation $t=x/V_{sw}$, where $V_{sw}$ is the velocity of the acoustic surface wave. The equation of phase in terms of distance $\phi(x)$ is utilized to provide the desired bandpass characteristic by positioning the edges of the interdigital fingers of the transducers along the surface of the substrate at distances where $\phi(x)=M\pi/2$. Once the positions of the finger edges are specified, the overlaps of the fingers are determined by the desired time amplitude function combined with the compensation that should be provided for a non-constant sampling rate as referred to above.

As a specific example of a bandpass filter designed in accordance with the invention, consider a passband of the form $$A(\omega) = 4/\Delta\omega\ 1/1+ (2\omega/\Delta\omega)^2,$$
$$-\Delta\omega/2 \le \omega \le \Delta\omega/2,$$

where $\Delta\omega$ is the $3db$ bandwidth of the signal as illustrated in FIG. 2. Also consider the time amplitude to be a constant and given by $$a(t) = 1/T\ 0 \le t \le T$$

where $T$ is the length of the FM signal of either of the transducers 13 or 14 of FIG. 1. To find the non-linear FM function corresponding to $A(\omega)$, equations 1 and 2 are utilized where, for bandpass filters, $$|U(\omega)|^2 = |A(\omega)|$$
$$|u(t)|^2 = |a(t)|$$

Firstly, the expressions for the amplitude functions must be substituted into equation 1 and the indicated integrations performed. Thus $$\frac{1}{\pi}\int_{\omega}^{\frac{\Delta\omega}{2}} \frac{1}{1+(2\omega/\Delta\omega)^2}\,\frac{d\omega}{\Delta\omega/2} = \frac{1}{T}\int_0^t dt$$

$$1/\pi\ (\pi/2 - \tan^{-1} 2\omega/\Delta\omega) = t/T$$

This expression is then solved for $f$ ($f=\omega/2\pi$) as follows:

$$f = \Delta\omega/4\pi\tan\ (\pi/2 - \pi t/T.$$

This resulting expression is then substituted into equation 2 and integrated, to yield $$\phi'(t) = \Delta\omega/2\ \tan\ (\pi/2 - \pi t/T)$$

$$\phi(t) = \frac{\Delta\omega}{2}\int \tan\left(\frac{\pi}{2}-\frac{\pi t}{T}\right)dt$$

$$\phi(t) = \Delta\omega T/2\pi \log \cos\ (\pi/2 - \pi t/T) + C \qquad (3)$$

where $C$ is a constant of integration to be hereinafter evaluated in terms of arbitrary boundary conditions.

The signal function 3, $\phi(t)$, has a center frequency of zero. Since it is normally required that the passband be centered around some carrier frequency $f_o$,$\omega_o t$ is added to the right side of the equation 3, where $\omega_o = 2\pi f_o$. The value of $T$ is chosen so that the product $T \cdot \Delta f$ is large compared to unity ($\Delta f = \Delta\omega/2\pi$). For many practical situations it is sufficient to make $T{\cdot}\Delta f = 10$, then $T = 10/\Delta f$. Since the waveform is determined by the spatial positioning of a set of fingers on a surface, it is convenient to convert equation 3 from a dependence on $t$ to a dependence on distance, $x$, by the relation $t=x/V_{sw}$, where $V_{sw}$ is the velocity of the acoustic surface wave. Making this substitution and the two described above, equation 3 becomes:

$$\phi(x) = 10 \log \cos\ (\pi/2 - \pi x/V_{sw}T) + \omega_o x/V_{sw} + C \qquad (4)$$

To synthesize this waveform in a transducer, the edges of the interdigital fingers are placed at positions along the surface at which $\phi(x) = n\pi/2$. Thus if one selects the first finger edge to be at $x=0$ and to correspond to zero phase, then the edges are placed according to the solutions to the equation $$(n-1)\ \pi/2 = 10 \log \cos\ (\pi/2 - \pi x_n/V_{sw}T) + \omega_o x_n/V_{sw} + C_o \qquad (5)$$

Equation 5 is merely equation 4 rewritten with the boundary conditions. $C_o$ is that value of $C$ which will make $\phi(x)=0$ when $x=0$.

Once the positions of the finger edges are determined, the overlaps of the fingers are determined by the desired time amplitude function, which for this example is a constant which may be designated $A_o$. In addition, compensation must be effected for a non-constant sampling rate, as taught in the said Tancrell and Holland article which discloses that this compensation is $$A_n = \pm\ 1/\sqrt{2}\,e(x_n)/4\phi'(x_n)$$

For this example $e(x_n) = A_o$ and $\phi'(x_n)$ is the derivative of equation 4. Thus $$A_n = +\ A_o/\ \sqrt{32}\,(10\pi/TV_{sw} \tan\ (\pi/2 - \pi x_n/TV_{sw}) + \omega_o/V_{sw}) \qquad (6)$$

It will be appreciated that the equation 5 specifies the interfinger spacing of the transducers and the equation 6 provides the finger overlap function for this example. The transducer instrumented in accordance with equations 5 and 6 is illustrated in FIG. 3 which schematically shows the dimensions $x_n$ and $A_n$. Two such transducers 13 and 14 are illustrated disposed on the surface 12 of the substrate 11 in FIG. 1 as previously described. Therefore, the bandpass filter exemplified herein provides the amplitude versus frequency characteristic $A(\omega)$ given above. Preferably the transducers 13 and 14 are disposed on the surface 12 colinearly with respect to each other with a spacing therebetween being arbitrarily chosen. The transducers may be positioned in almost abutting relationship but normally they are separated by a distance that will determine a delay between the input and the output signal, the delay being chosen in accordance with system requirements.

Because the invention provides independence of controlling the amplitude of the time response of a transducer and its frequency spectrum amplitude, filters that require specification of both the frequency response and the time response may be conveniently instrumented in accordance with the invention. For example, a filter for use in radar systems which may require low time domain sidelobes together with a locally flat amplitude versus frequency response near the band center, may conveniently be instrumented by the present invention.

The surface wave bandpass filter of the present invention may readily be fabricated by conventional printed circuit techniques utilizing a mask shaped to deposit the input and output transducers 13 and 14 on the surface 12 as required. Since the transducers 13 and 14 are translated images of one another, it is appreciated that the impedance of the filter 10 is the same looking into either the transducer 13 or the transducer 14 as is generally desired in bandpass filter design.

It will be appreciated from the foregoing that because of the relative independence in choosing the finger overlap function, the overlap may be designed to be within fixed limits so as to preclude distortions introduced by small or zero overlaps creating point energy sources as previously discussed. Since the filter output transducer is matched to the input transducer, passband distortion is eliminated relative to the prior art designs where the output transducer is of the broadband type as discussed above. It should be noted that in utilizing the present invention, it is possible to encompass a wider bandwidth than even that provided by a single finger pair. Filters designed in accordance with the invention have finger pairs that are resonant at frequencies over the filter passband resulting in lower insertion loss than the prior art design.

In summary, a surface wave bandpass filter is designed by shaping the phase versus time transducer function so as to provide the desired amplitude versus frequency response for the filter while utilizing the amplitude or envelope versus time transducer function to provide desirable filter characteristics. It will be appreciated that the amplitude or envelope versus time transducer function may normally be mildly graded so as to produce the desirable characteristics. The mild grading imparts only second order effects to the desired amplitude versus frequency characteristic for the filter.

While the invention has been described in its preferred embodiment, it is to be understood that the words which have been used are words of description rather than limitation and that changes within the purview of the appended claims may be made without departing from the true scope and spirit of the invention in its broader aspects.

We claim:

1. A non-dispersive surface wave bandpass filter having a predetermined amplitude versus frequency characteristic comprising substrate means, input transducer means on siad substrate means constructed to have a plurality of parallel electrodes with interelectrode spacing varying in accordance with a substantially continuous non-linear frequency versus time characteristic, and output transducer means on said substrate means constructed as the translated image of said input transducer means, said non-linear frequency versus time characteristic being chosen to provide said predetermined amplitude versus frequency characteristic for said filter.

2. The filter of claim 1 in which said input transducer means includes interleaved fingers, the inter-finger spacing thereof varying in accordance with a substantially continuous non-linear function of distance along said input transducer means, thereby providing said non-linear frequency versus time characteristic.

3. The filter of claim 1 in which said input transducer means comprises a non-linear FM pulse expansion filter, and said output transducer means comprises a non-linear FM pulse compression filter matched to said pulse expansion filter.

4. The filter of claim 2 in which said fingers are constructed and arranged with respect to each other to have an overlap grading to impart desirable characteristics to said bandpass filter.

5. The filter of claim 2 in which said fingers are constructed and arranged with respect to each other to have an overlap grading to compensate for the nonconstant smapling rate of the time domain waveform by said transducer means.

6. A method for designing a surface wave bandpass filter comprising the steps of determining the desired amplitude versus frequency characteristic for said filter, deriving a phase function of distance along the input transducer of said filter, the corresponding frequency versus time characteristic determining said amplitude versus frequency characteristic, disposing said input transducer on the substrate of said filter with the edges of the fingers thereof positioned in accordance with the distances determined by said phase function assuming values of integral multiples of $\pi/2$, and disposing the output transducer of said filter on said substrate as, the translated image of said input transducer.

7. The method of claim 6 in which said deriving step comprises the step of deriving said phase function in accordance with the principle of stationary phase.

8. The method of claim 7 in which said deriving step comprises the steps of substituting said desired amplitude versus time characteristic $A(\omega)$ and the desired amplitude versus time characteristic $a(t)$ for said filter in the equation $$\frac{1}{2\pi}\int_{\omega}^{\infty} |U(\omega)|^2 d\omega = \int_0^t |u(t)|^2 dt,$$

solving said equation for a frequency function of time $f(t)$, and deriving said phase function in accordance with the equation $\phi'(t) = 2\pi f(t)$, where $\omega = 2\pi f$.

* * * * *